(12) United States Patent
Yamazaki (10) Patent No.: US 6,784,033 B1
(45) Date of Patent: Aug. 31, 2004

(54) METHOD FOR THE MANUFACTURE OF AN INSULATED GATE FIELD EFFECT SEMICONDUCTOR DEVICE

(75) Inventor: Shunpei Yamazaki, Tokyo (JP)

(73) Assignee: Semiconductor Energy Laboratory Co., Ltd., Kanagawa (JP)

( * ) Notice: Subject to any disclaimer, the term of this patent is extended or adjusted under 35 U.S.C. 154(b) by 0 days.

(21) Appl. No.: 08/379,763

(22) Filed: Jan. 27, 1995

Related U.S. Application Data (63) Continuation of application No. 08/113,759, filed on Aug. 31, 1993, now abandoned, which is a continuation of application No. 07/985,445, filed on Dec. 3, 1992, now abandoned, which is a continuation of application No. 07/767,625, filed on Sep. 30, 1991, now abandoned, which is a continuation of application No. 07/471,060, filed on Jan. 29, 1990, now abandoned, which is a continuation of application No. 07/304,888, filed on Feb. 1, 1989, now abandoned.

(30) Foreign Application Priority Data

Feb. 15, 1984 (JP) ............................................. 59/26594
Dec. 13, 1984 (JP) ............................................ 59/263279

(51) Int. Cl.$^7$ ..................... H01L 21/336; B08B 9/027
(52) U.S. Cl. ....................... 438/151; 438/905; 438/158; 134/1.1
(58) Field of Search ............................... 438/157, 905, 438/706, 710, 708, 709, 158; 134/1.1, 1

(56) References Cited

U.S. PATENT DOCUMENTS

| | | | |
|---|---|---|---|
| 3,228,812 A | 1/1966 | Blake | 427/93 X |
| 3,338,209 A | 8/1967 | Bhola | 118/49.5 |
| 3,404,661 A | 10/1968 | Mathias et al. | |
| 3,485,666 A | 12/1969 | Sterling et al. | 427/37 |
| 3,594,227 A | 7/1971 | Oswald | |
| 3,627,590 A | 12/1971 | Mammel | |
| 3,661,637 A | 5/1972 | Sirtl | |
| 3,664,931 A | 5/1972 | Gerstenberg | |
| 3,785,853 A | 1/1974 | Kirkman et al. | |
| 3,793,090 A | 2/1974 | Barile et al. | |
| 3,875,068 A | 4/1975 | Mitzel | |
| 3,911,579 A | 10/1975 | Lane et al. | |
| 3,967,981 A | 7/1976 | Yamazaki | |
| 3,999,212 A | 12/1976 | Usuda | |

(List continued on next page.)

FOREIGN PATENT DOCUMENTS

| | | | |
|---|---|---|---|
| DE | 3144016 A1 | 7/1982 | ........... 118/723 MR |
| EP | 0 095 275 | 11/1983 | |
| EP | 0 095 275 A3 | 11/1983 | |
| EP | 0 106 637 | 4/1984 | |
| EP | 0 106 637 A1 | 4/1984 | |
| EP | 0 109 808 A2 | 5/1984 | |
| EP | 0 109 808 | 5/1984 | |
| EP | 0 160 365 A1 | 11/1985 | |
| EP | 10160 365 | 11/1985 | |

(List continued on next page.)

OTHER PUBLICATIONS

"Thin Film Handbook," published Dec. 10, 1983, pp. 622–625.

Lakatos, "Promise and Challenge of Thin–Film Silicon Approaches to Active Matrices", 1982 International Display Research Conference, © 1982 IEEE, pp. 146–151.

(List continued on next page.)

Primary Examiner—Mary Wilczewski
(74) Attorney, Agent, or Firm—Eric J. Robinson; Robinson Intellectual Property Law Office (57) ABSTRACT

A method for the manufacture of an insulated gate field effect semiconductor device comprised of a semiconductor substrate, a gate insulating layer member having at least an insulating layer, and a gate electrode. The insulating layer is formed of silicon or aluminum nitride on the semiconductor substrate or the gate electrode by a photo CVD process.

48 Claims, 2 Drawing Sheets

U.S. PATENT DOCUMENTS

| | | | |
|---|---|---|---|
| 4,006,340 A | 2/1977 | Gorinas | 219/121 P |
| 4,013,533 A | 3/1977 | Cohen-Solal et al. | |
| 4,088,456 A | 5/1978 | Giorgi et al. | 55/179 |
| 4,123,316 A | 10/1978 | Tsuchimoto | 156/643 |
| 4,138,306 A | 2/1979 | Niwa | |
| 4,141,811 A | 2/1979 | Yerkes et al. | |
| 4,149,307 A | 4/1979 | Henderson | |
| 4,151,537 A | 4/1979 | Goldman et al. | |
| 4,171,235 A | 10/1979 | Fraas et al. | |
| 4,183,780 A | 1/1980 | McKenna et al. | |
| RE30,244 E | 4/1980 | Alexander, Jr. et al. | |
| 4,223,048 A | 9/1980 | Engle, Jr. | 427/39 |
| 4,226,208 A | 10/1980 | Nishida et al. | |
| 4,226,897 A | 10/1980 | Coleman | |
| 4,262,631 A | 4/1981 | Kubacki | |
| 4,264,393 A | 4/1981 | Gorin et al. | |
| 4,274,936 A | 6/1981 | Love | |
| 4,282,267 A | 8/1981 | Küyel | 427/38 |
| 4,298,419 A | 11/1981 | Suzuki et al. | |
| 4,317,844 A | 3/1982 | Carlson | |
| 4,328,258 A | 5/1982 | Coleman | |
| 4,330,384 A | 5/1982 | Okudaira et al. | |
| 4,330,570 A | 5/1982 | Giuliani et al. | 427/64 |
| 4,332,522 A | 6/1982 | Saulgeot | 415/90 |
| 4,363,828 A | 12/1982 | Brodsky et al. | |
| 4,365,107 A | 12/1982 | Yamauchi | 427/39 |
| 4,371,587 A * | 2/1983 | Peters | 427/53.1 |
| 4,398,343 A | 8/1983 | Yamazaki | |
| 4,399,014 A | 8/1983 | Engle | |
| 4,401,054 A | 8/1983 | Matsuo et al. | |
| 4,401,507 A | 8/1983 | Engle | |
| 4,402,997 A | 9/1983 | Hogan et al. | 118/71.5 |
| 4,421,592 A | 12/1983 | Shuskus et al. | |
| 4,435,445 A | 3/1984 | Allred et al. | 427/54.1 |
| 4,438,188 A | 3/1984 | Shimatani et al. | |
| 4,438,368 A | 3/1984 | Abe | 315/39 |
| 4,438,723 A | 3/1984 | Cannella et al. | |
| 4,451,503 A | 5/1984 | Blum et al. | 427/53.1 |
| 4,461,783 A | 7/1984 | Yamazaki | 427/39 |
| 4,464,415 A | 8/1984 | Yamazaki | |
| 4,481,042 A | 11/1984 | Takigawa et al. | |
| 4,481,229 A | 11/1984 | Suzuki et al. | |
| 4,481,230 A | 11/1984 | Hanak | |
| 4,485,125 A | 11/1984 | Izu et al. | |
| 4,492,605 A | 1/1985 | Ishihara et al. | |
| 4,492,620 A | 1/1985 | Matsuo et al. | |
| 4,492,716 A | 1/1985 | Yamazaki | |
| 4,495,218 A * | 1/1985 | Azuma et al. | 427/53.1 |
| 4,496,423 A | 1/1985 | Walton | 156/345 |
| 4,501,766 A | 2/1985 | Suzuki et al. | |
| 4,503,807 A | 3/1985 | Nakayama et al. | |
| 4,505,950 A | 3/1985 | Yamazaki | |
| 4,509,451 A | 4/1985 | Collins et al. | 427/39 |
| 4,515,107 A | 5/1985 | Fournier et al. | |
| 4,522,663 A | 6/1985 | Ovshinsky et al. | |
| 4,522,674 A | 6/1985 | Ninomiya et al. | 156/345 |
| 4,525,382 A | 6/1985 | Sugioka | 427/54.1 |
| 4,529,474 A | 7/1985 | Fujiyama et al. | |
| 4,529,475 A | 7/1985 | Okano et al. | 156/643 |
| 4,530,818 A | 7/1985 | Gutermann | 422/240 |
| 4,532,022 A | 7/1985 | Takasaki et al. | 427/39 |
| 4,532,196 A | 7/1985 | Yasui et al. | 427/39 |
| 4,532,199 A | 7/1985 | Ueno et al. | 427/39 |
| 4,534,033 A | 8/1985 | Nishizawa et al. | |
| 4,534,816 A | 8/1985 | Chen et al. | |
| 4,537,795 A | 8/1985 | Nath et al. | |
| 4,539,068 A | 9/1985 | Takagi et al. | 427/39 |
| 4,539,934 A | 9/1985 | Fujiyama et al. | |
| 4,543,267 A | 9/1985 | Yamazaki | |
| 4,543,465 A | 9/1985 | Sakudo | 219/121 PD |
| 4,544,423 A | 10/1985 | Tsuge et al. | 427/74 |
| 4,550,684 A | 11/1985 | Mahawili | |
| 4,563,367 A | 1/1986 | Sherman | |
| 4,564,997 A | 1/1986 | Matsuo et al. | |
| 4,568,565 A | 2/1986 | Gupta et al. | 427/255.2 |
| 4,568,626 A | 2/1986 | Ogawa | |
| 4,576,698 A | 3/1986 | Gallagher et al. | |
| 4,579,609 A | 4/1986 | Reif et al. | |
| 4,581,100 A | 4/1986 | Hatzakis et al. | 156/643 |
| 4,582,720 A | 4/1986 | Yamazaki | |
| 4,585,541 A | 4/1986 | Miyake | 204/298 |
| 4,585,668 A | 4/1986 | Asmussen et al. | |
| 4,587,720 A * | 5/1986 | Chenevas-Paule et al. | |
| 4,588,610 A | 5/1986 | Yamazaki | |
| 4,592,306 A | 6/1986 | Gallego | |
| 4,598,665 A | 7/1986 | Tanaka | 118/715 |
| 4,608,063 A * | 8/1986 | Kurokawa | 55/208 |
| 4,608,117 A | 8/1986 | Ehrlich et al. | 427/53.1 |
| 4,613,400 A | 9/1986 | Tam et al. | |
| 4,615,298 A | 10/1986 | Yamazaki | 118/723 |
| 4,615,905 A | 10/1986 | Ovshinsky et al. | |
| 4,624,736 A | 11/1986 | Gee et al. | 118/728 |
| 4,625,678 A | 12/1986 | Shioya et al. | |
| 4,629,635 A | 12/1986 | Brors | |
| 4,636,401 A * | 1/1987 | Yamazaki et al. | 427/39 |
| 4,645,684 A | 2/1987 | Osada et al. | 427/38 |
| 4,654,226 A | 3/1987 | Jackson et al. | 427/54.1 |
| 4,655,800 A * | 4/1987 | Tsukada et al. | 55/208 |
| 4,657,616 A | 4/1987 | Benzing et al. | |
| 4,664,769 A | 5/1987 | Cuomo et al. | |
| 4,664,938 A | 5/1987 | Walker | 118/723 MP X |
| 4,666,734 A | 5/1987 | Kamiya et al. | |
| 4,668,365 A | 5/1987 | Foster et al. | |
| 4,681,653 A | 7/1987 | Purdes et al. | 427/39 |
| 4,683,838 A | 8/1987 | Kimura | 118/715 |
| 4,685,195 A * | 8/1987 | Szydlo et al. | |
| 4,687,544 A | 8/1987 | Bersin | 156/345 |
| 4,693,211 A | 9/1987 | Ogami et al. | |
| 4,695,331 A | 9/1987 | Ramaprasad | 427/54.1 |
| 4,695,700 A | 9/1987 | Provence et al. | |
| 4,699,805 A | 10/1987 | Seelbach et al. | 118/71.5 |
| 4,700,458 A * | 10/1987 | Suzuki et al. | |
| 4,702,934 A | 10/1987 | Ishihara et al. | 427/39 |
| 4,713,258 A | 12/1987 | Umemura | 427/35 |
| 4,719,123 A | 1/1988 | Haku et al. | |
| 4,726,963 A | 2/1988 | Ishihara et al. | 427/53.1 |
| 4,727,293 A | 2/1988 | Asmussen et al. | |
| 4,728,528 A | 3/1988 | Ishihara et al. | 427/53.1 |
| 4,745,088 A | 5/1988 | Inoue et al. | |
| 4,747,368 A | 5/1988 | Brien et al. | |
| 4,759,947 A | 7/1988 | Ishihara et al. | 427/53.1 |
| 4,762,728 A | 8/1988 | Keyser et al. | |
| 4,767,641 A | 8/1988 | Kieser et al. | |
| 4,798,166 A | 1/1989 | Hirooka et al. | |
| 4,800,174 A | 1/1989 | Ishihara et al. | |
| 4,808,553 A | 2/1989 | Yamazaki | |
| 4,808,554 A | 2/1989 | Yamazaki | |
| 4,811,684 A | 3/1989 | Tashiro et al. | 118/50.1 |
| 4,825,808 A | 5/1989 | Takahashi et al. | |
| 4,828,369 A | 5/1989 | Hotomi | 350/357 |
| 4,832,981 A | 5/1989 | Yamazaki | |
| 4,857,139 A * | 8/1989 | Tashiro et al. | |
| 4,883,560 A | 11/1989 | Ishihara | 118/723 MP X |
| 4,909,914 A | 3/1990 | Chiba et al. | 204/164 |
| 4,913,929 A | 4/1990 | Moslehi et al. | 427/39 |
| 4,915,979 A | 4/1990 | Ishida | 118/723 |
| 4,919,077 A | 4/1990 | Oda et al. | |
| 4,947,085 A | 8/1990 | Nakanishi | 315/111.41 |
| 4,951,601 A | 8/1990 | Maydan et al. | |
| 4,960,488 A | 10/1990 | Law et al. | |
| 4,982,138 A | 1/1991 | Fujiwara | 315/11.41 |

| | | | |
|---|---|---|---|
| 4,988,642 A | 1/1991 | Yamazaki | |
| 4,998,642 A | 3/1991 | Kraus | |
| 5,000,113 A | 3/1991 | Wang et al. | |
| 5,034,086 A | 7/1991 | Sato | |
| 5,081,398 A | 1/1992 | Asmussen et al. | 314/111.41 |
| 5,110,619 A | 5/1992 | Ogumi et al. | |
| 5,158,644 A | 10/1992 | Cheung et al. | |
| 5,211,825 A | 5/1993 | Saito et al. | 204/298.32 |
| 5,230,931 A | 7/1993 | Yamazaki et al. | 427/569 |
| 5,283,087 A | 2/1994 | Yamazaki et al. | 427/577 |
| 5,298,452 A | 3/1994 | Meyerson | |
| 5,470,784 A | 11/1995 | Coleman | |
| 5,487,787 A | 1/1996 | Cann et al. | 118/723 R |
| 5,503,676 A | 4/1996 | Shufflebotham et al. | 118/723 MR |
| 5,512,102 A | 4/1996 | Yamazaki | 118/723 MW |
| 5,543,634 A | 8/1996 | Coleman | |
| 5,650,013 A | 7/1997 | Yamazaki | |
| 5,780,313 A | 7/1998 | Yamazaki | |
| 5,976,259 A | 11/1999 | Yamazaki | |
| 6,355,941 B1 | 3/2002 | Yamazaki et al. | |

FOREIGN PATENT DOCUMENTS

| | | | |
|---|---|---|---|
| FR | 2397067 | 2/1979 | |
| GB | 1151746 | 5/1969 | |
| GB | 2 076 587 A | 12/1981 | |
| GB | 2 119 406 A | 11/1983 | |
| JP | 51-61265 | 5/1976 | |
| JP | 54-33668 | 3/1979 | |
| JP | 54-59878 | 5/1979 | |
| JP | 51-153740 | 12/1979 | |
| JP | 556410 | 1/1980 | |
| JP | 55-6410 | 1/1980 | |
| JP | 5521553 | 2/1980 | |
| JP | 5578524 | 6/1980 | |
| JP | 55-105332 | 8/1980 | |
| JP | 55141570 | 11/1980 | |
| JP | 56110236 | 9/1981 | |
| JP | 59-110236 | 9/1981 | |
| JP | 56-135968 | 10/1981 | |
| JP | 56-151287 | 11/1981 | |
| JP | 56-152738 | 11/1981 | |
| JP | 56-155535 | 12/1981 | |
| JP | 5739430 | 3/1982 | |
| JP | 57-44786 | 3/1982 | |
| JP | 57-49082 | 3/1982 | |
| JP | 57-66625 | 4/1982 | |
| JP | 57149748 | 9/1982 | |
| JP | 57-166310 | 10/1982 | |
| JP | 57-167631 | 10/1982 | |
| JP | 57-177975 | 11/1982 | |
| JP | 57-59920 | 12/1982 | |
| JP | 57-201016 | 12/1982 | |
| JP | 572011016 | 12/1982 | |
| JP | 58-44295 | 3/1983 | |
| JP | 5892217 | 6/1983 | |
| JP | 5892218 | 6/1983 | |
| JP | 58-93321 | 6/1983 | |
| JP | 5893321 | 6/1983 | |
| JP | 58-95550 | 6/1983 | |
| JP | 58-97826 | 6/1983 | |
| JP | 58-173826 | 10/1983 | |
| JP | 58-196063 | 11/1983 | |
| JP | 59-16328 | 1/1984 | |
| JP | 59-16329 | 1/1984 | |
| JP | 59-18284 | 1/1984 | |
| JP | 59-028345 | 2/1984 | |
| JP | 59-41470 | 3/1984 | |
| JP | 59-52833 | 3/1984 | |
| JP | 59-52834 | 3/1984 | |
| JP | 59-56725 | 4/1984 | |
| JP | 59-72142 | 4/1984 | |
| JP | 59-100516 | 6/1984 | |
| JP | 59-123766 | 7/1984 | |
| JP | 59129772 | 7/1984 | |
| JP | 59-145779 | 8/1984 | |
| JP | 59-145780 | 8/1984 | |
| JP | 59-208791 | 11/1984 | |
| JP | 59216625 | 12/1984 | |
| JP | 59-216625 | 12/1984 | |
| JP | 59-220918 | 12/1984 | |
| JP | 60-37118 | 2/1985 | |
| JP | 60-033300 | 2/1985 | |
| JP | 60-43819 | 3/1985 | |
| JP | 60-50167 | 3/1985 | |
| JP | 60-89919 | 5/1985 | |
| JP | 60-138909 | 7/1985 | |
| JP | 60167318 | 8/1985 | |
| JP | 60-170234 | 9/1985 | |
| JP | 60-180999 | 9/1985 | 423/466 |
| JP | 60-194060 | 10/1985 | |
| JP | 60-224216 | 10/1985 | |
| JP | 60-224215 | 11/1985 | |
| JP | 60-224216 | 11/1985 | |
| JP | 60-245217 | 12/1985 | |
| JP | 61-32511 | 2/1986 | |
| JP | 61 99682 | 6/1986 | |
| JP | 61-143579 | 7/1986 | |
| JP | 61-199626 | 9/1986 | |
| JP | 62-89874 | 2/1987 | |
| JP | 62-89874 | 4/1987 | |
| JP | 62-89875 | 4/1987 | |
| JP | 62-89876 | 4/1987 | |
| JP | 62-89882 | 4/1987 | |
| JP | 62-112318 | 5/1987 | |
| JP | 62-118520 | 5/1987 | |
| JP | 62-120477 | 6/1987 | |
| JP | 62-143418 | 6/1987 | |
| JP | 01-275761 | 11/1989 | 118/723 |
| JP | 02-232372 | 9/1990 | 118/723 MP |
| WO | 8606687 | 11/1986 | |
| WO | 8707309 | 12/1987 | |

OTHER PUBLICATIONS

Chen et al., "Photo–CVD for VLSI Isolation", Journal of the Electrochemical Society, vol. 131, No. 9, Sep. 1984, pp. 2146–2151.

Chow et al., "Plasma Etching of Refractory Gates for VLSI Applications", Journal of the Electrochemical Society, vol. 131, No. 10, Oct. 1984, pp. 2325–2335.

Sakai et al., "Amorphous Silicon Solar Cells Produced by Combination of Plasma and Photo–CVD Techniques", Proceedings, 6$^{th}$ E.C. Photovoltaic Solar Energy Conference, London, Apr. 15–19, 1985, pp. 682–686.

Horky, "Evaporator–Sputter Shield", IBM Technical Disclosure Bulletin, vol. 23, No. 6, Nov. 1980, p. 2548.

\*\*Kuwano et al., "Tetrahedal Alloys", Chapter 3.5, pp. 108–118.

Tsai et al., "Amorphous Si Prepared in a UHV Plasma Deposition System", Journal of Non–Crystalline Solids, vols. 59 & 60, (1983), pp. 731–734.

\*\* Extended Abstracts (32$^{nd}$ Spring Meeting, Mar. 1985, p. 423 (with English Explanation).

\*\* Fink et al., "Disposable Sputtering Shield", IBM Technical Disclosure Bulletin, vol. 14, No. 1, Jun. 1971, p. 184.

\*\*Hirose, "Recent Amorphous Silicon", Nikkei Electronics, Dec. 20, 1982, pp. 163–179 (with English Explanation).

\*\*Weil et al., "Glow–Discharge", Oct. 1981, pp. 643–646.

**Bunshah et al., "Deposition Technologies", (1982), pp. 376.

**Maissel et al., "Handbook of Thin–Film Transistor", pp. 2–4 to 2–9.

**Outlaw, "Ultrahigh Vacuum", vol. 3, No. 6, (1966), pp. 352–354.

Iwamatsu et al., 28p–P–4, *Evaluation of Photochemical CVD Film ($SiO_2$, $Si_3N_4$)*, The Japan Society of Applied Physics, Sep., 1982, p. 394.

Kausche et al., "Influence of Plasma Etching in a Multi Chamber System on a–Si Solar Performance", Fifth E.C. Photovoltaic Solar Energy Conference, Commission of the European Communities, Athens, Greece, Oct. 17–21, 1983, pp. 706–711.

English Translation of Itoh et al., Ionics, Jul. 1981.

Matsumura, "Amorhous Silicon Transistors and Integrated Circuits", Proceedings of the 14th Conf. (1982 International) on Solid State Devices, Jap. J. of Appl. Phys., vol. 22 (1983), Suppl. 22–1, pp. 487–491.*

H. Frederick Dylla; "A Turbomolecular Pump Vacuum System for the Princeton Large" (Plasma Physics Laboratory, Princeton University, Princeton, NJ) Nov. 21, 1977; pp. 734–740.

Sorab K. Ghandhi, "VLSI Fabriction Principles Silicon and Gallium Arsenide"; Rensselaer Polytechnic Institute, pp. 517–520.

"A User's Guide to Vacuum Technology" by John F. O'Hanlon, Research Staff Member IBM Thomas J. Watson Research Center.

Kuwano et al., "Tetrahedal Alloys", *Amorphous Semiconductor Technologies & Devices,* Chapter 3.5, (1984) pp. 108–118.

Extended Abstracts of the $32^{nd}$ Spring Meeting, Japan Society of Applied Physics and Related Sciences, Mar. 1985, p. 423 (with English Explanation).

Fink et al., "Disposable Sputtering Shield", IBM Technical Disclosure Bulletin, vol. 14, No. 1, Jun. 1971, p. 184.

Hirose, "Recent Amorphous Silicon Manufacturing Technology Improved in Reproductivity", Nikkei Electronics, Dec. 20, 1982, pp. 163–179 (with English Explanation).

Weil et al., "Glow–Discharge a–Si:F Prepared from $SiF_2$ Gas", Proceedings of the Ninth International Conference on Amorphous and Liquid Semiconductors, Journal de Physique, Colloque C–4, No. 10, Oct. 1981, pp. 643–646.

Bunshah et al., "Deposition Technologies for Films and Coatings—Developments and Applications", (1982), pp. 376–377.

Maissel et al., "Handbook of Thin–Film Technology", pp. 2–4 to 2–9.

Outlaw, "Ultrahigh Vacuum Produced by a Combination of Turnomolecular and Titanium Sublimation Pumping", Journal of Vacuum Science and Technology, vol. 3, No. 6, (1966), pp. 352–354.

Kumagai et al., Vacuum Science and Engineering, Shokabo Corp., Apr. 20, 1970.

Brodsky et al., Method of Preparing Hydrogenated Amorphous Silicon, IBM Technical Disclosure Bulletin, vol. 22, No. 8A p. 3391–3392.

High–Conductive Wide Band Gap P–Type a: S:C:H Prepared By ECR CVD and its Application to High Efficiency a–S; Basis Solar Cells, Y. Hattori et al., Presented at 19th IEEE PVSC (New Orleans) May 4–8, 1987, pp. 1–6.

"Reactive Ion Beam Etching Using a Broad Beam ECR Ion Source", S. Matsuo and Y. Adachi, Japanese Journal of Applied Physics, vol. 21, No. 1, Jan., 1982, pp. L4–L6.

Itoh et al., IONICS, 7/81.

Webster's New World Dictionary, Third College Edition, 1988, p. 707.

Ghandhi, *VLSI Fabrication Principles,* John Wiley & Sons, 1983, pp. 517–520.*

Journal of Vacuum Science & Technology; H. Frederick Dylla "Turbomolecular pump vacuum system for the Princeton Large Torus" Plasma Physics Laboratory, Princeton University, Princeton, New Jersey 08540; (accepted Nov. 21, 1977).

* cited by examiner

METHOD FOR THE MANUFACTURE OF AN INSULATED GATE FIELD EFFECT SEMICONDUCTOR DEVICE

This application is a Continuation of Ser. No. 08/113,759, filed Aug. 31, 1993, now abandoned; which itself is a continuation of Ser. No. 07/985,445, filed Dec. 3, 1992, abandoned; which is a continuation of Ser. No. 07/767,625, filed Sep. 30, 1991, abandoned; which is a continuation of Ser. No. 07/471,060, filed Jan. 29, 1990, abandoned; which is a continuation of Ser. No. 07/304,888, filed Feb. 1, 1989, abandoned; which is a continuation of Ser. No. 06/808,554, filed Dec. 13, 1985.

BACKGROUND OF THE INVENTION

1. Field of the Invention

The present invention relates to a method for the manufacture of an insulated gate field effect semiconductor device having a gate insulating layer member and a gate electrode.

2. Description of the Prior Art

Heretofore there has been proposed, an insulated gate field effect semiconductor device which comprises a substrate having its surface formed of a semiconductor of silicon, a gate insulating layer member formed on the substrate and being an insulating silicon oxide layer, and a gate electrode formed on the gate insulating layer member.

For the manufacture of the device of such a structure, it has been proposed to form, by a thermal oxidation process, the insulating silicon oxide layer which forms the gate insulating layer member.

The thermal oxidation process allows more ease in the formation of the insulating layer of silicon oxide, and hence facilitates the fabrication of the device.

In the case where the insulating silicon oxide layer is formed as the gate insulating layer member through the thermal oxidation technique, when the gate electrode is formed on the gate insulating layer, they react with each other. This imposes a certain limitation on the reduction of the thickness of the insulating silicon oxide layer or the gate insulating layer member. Hence there is a certain limit to the fabrication of the device with a small channel length and accordingly with excellent frequency characteristics.

As a solution to this problem, it has been proposed to form the gate insulating layer member by a first insulating silicon oxide layer which is deposited in contact with the substrate surface and a second insulating silicon nitride layer which is deposited on the first insulating silicon oxide layer.

Conventionally the first insulating silicon oxide layer is obtained by the thermal oxidation technique, as mentioned above, and a plasma CVD technique is employed for the formation of the second insulating silicon nitride layer.

In this instance, since the gate electrode is deposited on the second insulating silicon nitride layer, the gate insulating layer member and the gate electrode do not substantially react with each other. Therefore, the gate insulating layer member can be formed to a sufficiently small thickness. However, the deposition of the second insulating silicon nitride layer by the plasma CVD process on the first insulating silicon oxide layer inflicts damage on the latter. This introduces difficulties in forming the first and second insulating layers and consequently the gate insulating layer member homogeneously and to a uniform thickness through it. Accordingly, it is difficult to fabricate device of excellent characteristics.

It has also been proposed to employ a low-pressure CVD technique for the deposition of the second insulating silicon nitride layer so as to avoid the above problem that the first insulating silicon oxide layer is damaged by the plasma CVD process for the formation thereon of the second insulating silicon nitride layer.

In a device fabricated by such a method, however, the voltage-capacitance characteristics between the semiconductor of the substrate and the gate electrode has a large hysteresis characteristic. Consequently, the threshold voltage of the device drifts in accordance with voltage which is applied across the semiconductor and the gate electrode. Accordingly, the use of the low-pressure CVD process for the second insulating silicon nitride layer always leads to the defect that the device has the above-said threshold voltage drift.

Furthermore, another method for forming the gate insulating layer has been proposed in which a silicon oxide layer is formed on the silicon surface of the substrate and then the silicon oxide layer is heat treated at a high temperature of around 1200° C. in an atmosphere of ammonia gas to thereby nitrify the surface of the silicon oxide layer so that the first insulating silicon oxide layer and the second insulating silicon nitride layer are formed.

With this method, it is possible to avoid the problem that is posed by the formation of the second insulating silicon nitride layer through the plasma CVD and the low-pressure CVD process. But the high temperature heat treatment for nitrifying the surface of the silicon oxide layer will inflict thermal damage on the substrate. Accordingly, a device of excellent characteristics cannot be obtained.

SUMMARY OF THE INVENTION

It is therefore an object of the present invention to provide a novel method for the manufacture of an insulated gate field effect semiconductor device having a gate insulating layer member and a gate electrode, and which is free from the above-said defects of the prior art.

According to the manufacturing method of the present invention, an insulating layer is formed as a layer constituting the gate insulating layer member by the photo CVD technique.

With the manufacturing method of the present invention, the insulating layer can be formed on the substrate in contact with its surface without inflicting any damage thereon. Further in the case of forming the insulating layer on the gate electrode, no damage will be inflicted on the gate electrode. Furthermore, in the case of forming the insulating layer as a second insulating layer on a first insulating layer, no damage will be inflicted on the latter.

In the case where the surface of the substrate is formed of silicon, the gate insulating layer member is composed of the first insulating silicon oxide layer and the second insulating silicon or aluminum nitride layer formed by the photo CVD technique, the deposition of the second insulating silicon or aluminum nitride layer by the photo CVD process will inflict substantially no damage on the first insulating silicon oxide layer. Moreover, since the deposition of the second insulating silicon or aluminum nitride layer by the photo CVD process does not involve any high-temperature heat treatment, no thermal damage will be caused to the semiconductor of the substrate. Besides when the gate electrode is formed on the gate insulating layer member, since it is formed on the silicon or aluminum nitride layer, they will show substantially no reactions with each other. Furthermore the voltage-capacitance characteristics between the semiconductor of the substrate and the gate electrode have not a large hysteresis characteristics.

DESCRIPTION OF THE PREFERRED EMBODIMENTS

Figure 1:
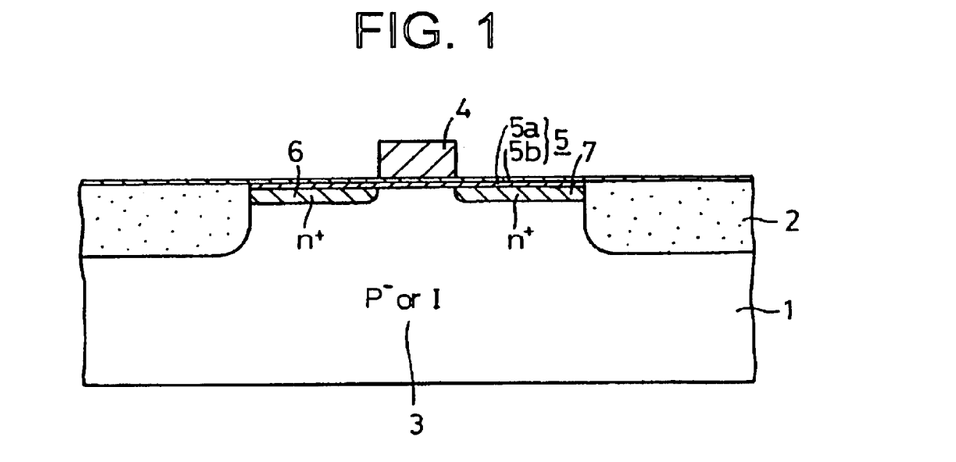
FIG. 1 is a schematic cross-sectional view illustrating a first embodiment of the insulating gate field effect semiconductor device manufactured by the method of the present invention.

FIG. 1 illustrates an example of an MIS transistor manufactured by the method of the present invention, which has the following structure.

This example employs, for example, an I- or $P^-$-type silicon substrate 1, which has a field isolation film 2 formed therein on the side of its top surface to define an island-like element forming region 3.

A gate electrode 4 extending also on the field isolation film 2 is formed on the semiconductor substrate 1, with a gate insulating layer member 5 interposed therebetween, in such a manner as to divide the element forming region 3 into two as viewed from above. The gate electrode 4 is formed of Mo, Ti, W, $WSi_2$, $MoSi_2$, $TiSi_2$ or the like. The gate insulating layer member 5 is a laminate member of a first insulating silicon oxide layer 5a formed on the substrate 1 and a second insulating silicon or aluminum nitride layer 5b formed on the first insulating silicon oxide layer 5a.

Two N- or $N^+$-type regions are provided as source and drain regions 6 and 7, respectively, in the element forming region 3 on both sides of the gate electrode 4.

The MIS transistor of such a structure is identical in construction with a conventional MIS transistor. Accordingly, it is possible to obtain the transistor function similar to that of the conventional MIS transistor.

Figure 2:
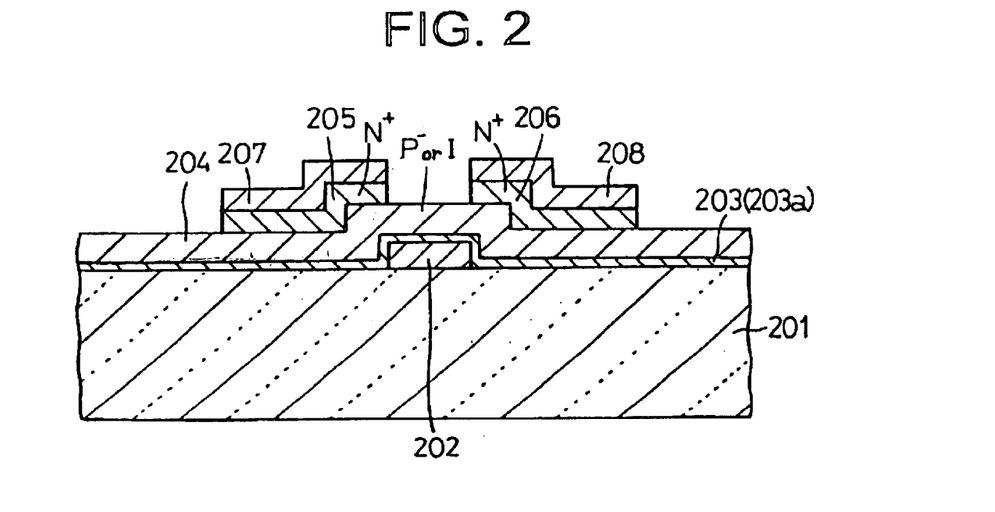
FIG. 2 is a schematic cross-sectional view illustrating a second embodiment of the insulated gate field effect semiconductor device manufactured by the method of the present invention.

Next, a description will be given, with reference to FIG. 2, of another MIS transistor which is produced by the manufacturing method of the present invention. In this example a gate electrode 202 is formed on a glass substrate 201.

A gate insulating layer member 203 is formed on the substrate 201, extending over the gate electrode 202. The gate insulating member 203 is formed by an insulating silicon or aluminum nitride layer 203a.

The gate insulating layer member 203 is covered with $p^-$- or I-type amorphous silicon layer 204.

On the silicon layer 204 are formed, as source and drain regions, $N^+$-type amorphous silicon layers 205 and 206 at opposite sides of the gate electrode 202, as viewed from above. The silicon layers 205 and 206 are covered with source and drain electrodes 207 and 208, respectively.

The MIS transistor of such a structure is identical in construction with a conventional MIS transistor. Accordingly, it is possible to obtain the transistor function similar to that of the conventional MIS transistor.

Next, a description will be given of the fabrication of the MIS transistors described previously with respect to FIGS. 1 and 2.

The method of the present invention manufacturing the MIS transistor shown in FIG. 1 includes a step of providing, by a known technique, a structure wherein the field isolation film 2 is formed in the silicon substrate 1 and the first insulating silicon oxide layer 5a of the gate insulating layer member 5 is formed on the substrate 1, a step of forming the second insulating silicon or aluminum nitride layer 5b on the first insulating silicon oxide layer 5a by a method of the present invention described later, a step of forming, by a known technique, the gate electrode 4 on the gate insulating layer member 5 composed of the first and second insulating layers 5a and 5b, and a step of forming the source and drain regions 6 and 7 in the silicon substrate 1 through a known self-alignment technique using the gate electrode 4. Incidentally the first insulating silicon oxide layer 5a is provided through the thermal oxidation process.

The method of the present invention for manufacturing the MIS transistor depicted in FIG. 2 includes a step of forming the gate electrode 202 on the glass substrate 201 by known technique, a step of forming, by a method of the present invention described later, the insulating silicon or aluminum nitride layer 203a as the gate insulating layer member 203 extending on the gate electrode 202, and a step of providing, by a known technique, a structure which includes the amorphous silicon layer 204 formed on the gate insulating layer member 203, the amorphous silicon layers 205 and 206 formed, as the source and drain regions, on the silicon layer 204 and source and drain electrodes 207 and 208 formed on the silicon layers 205 and 206, respectively.

Next, a description will be given of the method for forming the second insulating silicon or aluminum nitride layer 5b of the gate insulating layer member 5 in the manufacture of the MIS transistor shown in FIG. 1 and method for forming the insulating silicon or aluminum nitride layer 203a as the gate insulating layer member 203 in the manufacture of the MIS transistor depicted in FIG. 2.

Figure 3:
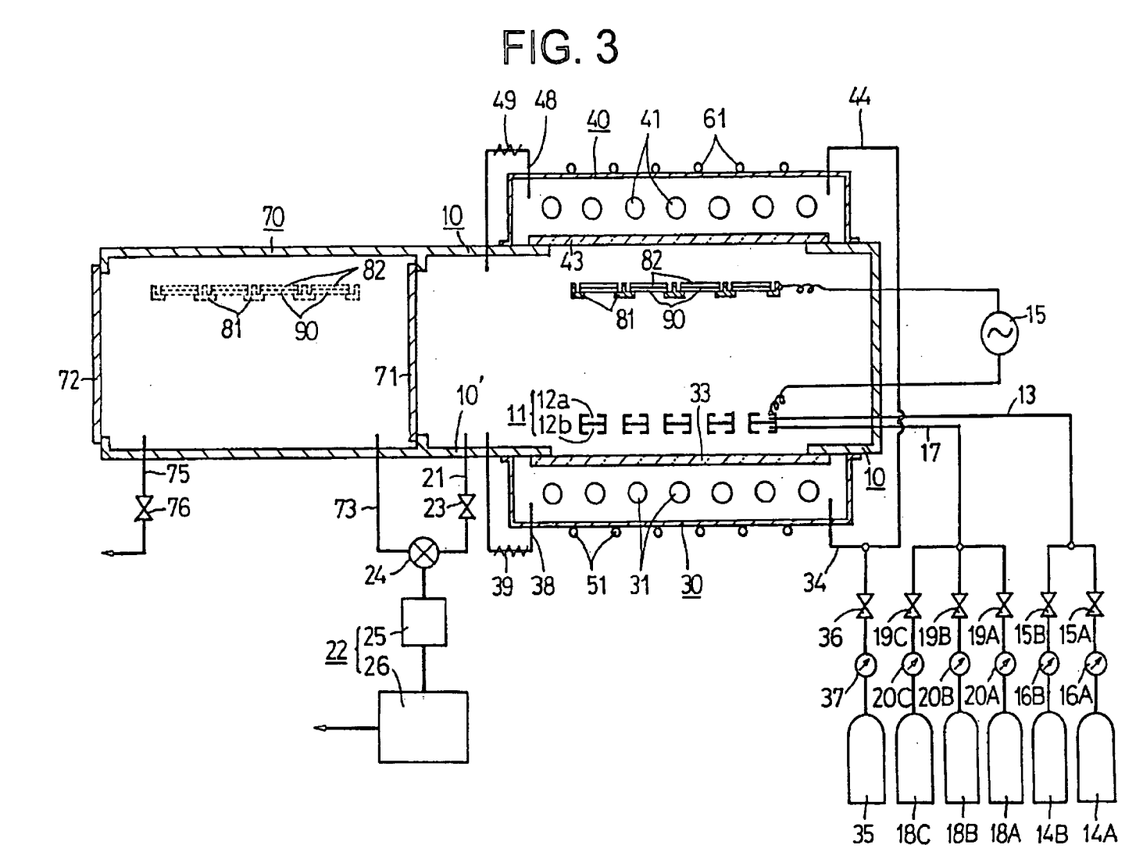
FIG. 3 is a schematic cross-sectional view showing the method for manufacture of the insulated gate field effect semiconductor device of the present invention, and an apparatus employed therefor.

A description will be given first of an apparatus for the formation of the insulating silicon or aluminum nitride layer 5b and 203a according to the present invention.

The apparatus has a conductive reaction chamber 10. The reaction chamber 10 is provided with a plurality of conductive nozzles 11 arranged at the lower portion of the chamber 10 and each having upper and lower nozzle parts 12a and 12b. The conductive nozzles 11 are connected to one end of a power supply 15 for gas excitation.

A gas introducing pipe 13 is connected to the upper nozzle parts 12a of the nozzle 11 and extends out of the reaction chamber 10. The gas introducing pipe 13 is connected to a gas source 14A via a valve 15A and a flowmeter 16A and to another gas source 14B via a valve 15B and a flowmeter 16B.

Another gas introducing pipe 17 is connected to the lower nozzle parts 12b of the nozzle 11 and extends out of the reaction chamber 10. The gas introducing pipe 17 is connected to a gas source 18A via a valve 19A and a flowmeter 20A, to a gas source 18B via a valve 19B and a flowmeter 20B and to a gas source 18C via a valve 19C and a flowmeter 20C.

The reaction chamber 10 is provided with an exhaust pipe 21 which extends to the outside through the bottom wall of its extending portion 10' wherein the nozzles 11 are not placed. The exhaust pipe 21 is connected to a vacuum pump system 22 via a control valve 22 and a change-over valve 24. The vacuum pump system 22 has a tandem structure of a turbo pump 25 and a rotary pump 26.

Provided on the bottom wall of the reaction chamber 10 is a light source chamber 30, in which is disposed light sources 31 each of which emits ultraviolet rays as light having a wavelength 400 nm or less, such as a low pressure mercury lamp. The light sources 31 are connected to an external power supply (not shown). Provided on the bottom wall of the chamber 30 are cooling pipes 51 which are connected to a cooling tower (not shown).

The reaction chamber 10 and the light source chamber 30 optionally intercommunicate through a window 33 made in, for instance, a quartz plate disposed therebetween.

The light source chamber 30 has a gas introducing pipe 34 which extends to the outside through its one end portion of the bottom wall. The gas introduction pipe 34 is connected to a gas source 35 via a valve 36 and flowmeter 37. The light source chamber 30 has an exhaust pipe 38 which extends from the other end portion of the bottom wall of the chamber 30 into the extending portion 10' of the reaction chamber 10. A heater 39 is provided on the exhaust pipe 38.

Disposed on the upper wall of the reaction chamber 10 is a heat source chamber 40, in which is disposed a heat source 41 formed by, for example, a halogen lamp. The heat source 41 is connected to an external power supply (not shown). Provided on the top wall of the chamber 40 are cooling pipes 61 which are connected to the above-said cooling tower.

The reaction chamber 10 and the heat source chamber 40 thermally intercommunicate through a window 43 made in, for example, quartz plate disposed therebetween.

The light source chamber 40 has a gas introducing pipe 44 which extends through its one end portion of the upper wall to the outside and is connected to above-said gas source 35 via the valve 36 and the flowmeter 37. The heat source chamber 40 has an exhaust pipe 48 which extends from its other end portion of the upper wall into the extending portion 10' of the reaction chamber 10. A heater 49 is provided on the exhaust pipe 48.

The reaction chamber 10 has attached thereto on the side of its extending portion 10' a substrate take-in/take-out chamber 70 with a shutter means 71 interposed therebetween. The shutter means 71 is selectively displaced to permit or inhibit the intercommunication therethrough between the chambers 10 and 70.

The chamber 70 has another shutter means 72 on the opposite side from the shutter means 71. The chamber 70 has an exhaust pipe 73 which extends from its bottom to the vacuum system 22 via the aforementioned change-over valve 24. The chamber 70 has another pipe 75 which extends to the outside and terminates into the atmosphere via a valve 76.

The apparatus includes a conductive holder 81 for mounting a plurality of substrate members 90. The holder 81 is combined with thermally conductive press plates 82 for placing on the substrate members 90 mounted on the holder 81.

According to the present invention, the above-said insulating silicon nitride layer 5b and 203a are formed through use of such an apparatus, for example, as follows.

(1) The shutter means 71 between the reaction chamber 10 and the substrate take-in/take-out chamber 70, the shutter means 72 of the chamber 70, a valve 76 between the chamber 70 and the outside, the valves 15A and 15B between the nozzles parts 12a and the gate sources 14A and 14B, the valve 19A, 19B and 19C between the nozzle parts 12b and the gas sources 18A, 18B and 18C and the valve 36 between the chambers 30 and 40 and the gas source 35 are closed.

(2) Next, the valve 23 between the reaction chamber 10 and the vacuum pump system 22 is opened and change-over valve 24 is also opened to the both chambers 10, 70, 30 and 40 to a pressure of $10^{-7}$ Torr.

(3) Next, the turbo pump 25 and the rotary pump 26 of the vacuum pump system 22 are activated, evacuating the chambers 10 and 70.

(4) Next, the valve 23 is closed and the change-over valve 24 is also closed relative to the both chambers 10 and 70, followed by stopping of the vacuum pump system 22 from operation.

(5) Next, the valve 76 is opened, raising the pressure in the chamber 70 up to the atmospheric pressure.

(6) Next, the shutter means 72 is opened, through which the substrate 1 or 201 mounted on a holder 81 with its surface for the formation thereon of the layer held down, is placed in the chamber 70 with a press plate 82 mounted on the substrate 1 or 201. On the substrate 1 the insulating silicon oxide layer 5a is formed. On the substrate 201 the gate electrode 202 is formed.

(7) Next, the shutter means 72 and the valve 76 are closed.

(8) Next, the change-over valve 24 is opened to the chamber 70 alone and the pump system 22 is activated, evacuating the chamber 70 to substantially the same vacuum as that in which the chamber 10 is retained.

(9) Next, the change-over valve 24 is closed relative to the both chambers 10 and 70 and then the pump system 22 is stopped from operation.

(10) Next, the shutter means 71 is opened, the holder 81 carrying the substrate 1 or 201 is moved from the chamber 70 into the chamber 10 and disposed at a predetermined position in the upper part of the chamber 10. At this time, the holder 81 is connected to the other end of the power source 15.

(11) Next, the shutter means 71 is closed.

(12) Next, the heat source 41 in the heat source chamber 40 is turned ON, heating the substrate 1 or 201 up to a temperature of 25 to 1000° C., preferably of 100 to 500° C., especially of 350° C.

(13) Next, the light source 31 in the light source chamber 30 is turned ON.

(14) Next, the valve 19A connected to the lower nozzle part 12b of the nozzle 11 in the reaction chamber 10 is opened, through which ammonia gas ($NH_3$) is introduced as a first reactive material gas from the gas source 18A into the chamber 10. At the same time, the valve 23 is opened and the valve 24 is opened relative to the chamber 10 alone and, further, the pump system 22 is activated, raising the pressure in the chamber 0.1 to 100 Torr, preferably 1 to 10 Torr. Then the valve 15B connected to the upper nozzle parts 12a of the nozzle 11 is opened, through which disilane ($Si_2H_6$) is introduced as a second reactive material gas from the gas source 14B into the chamber 10 to provide therein a gas mixture of the ammonia gas and the disilane. The pressure in the chamber 10 is held at 0.1 to 100 Torr, preferably at 1 to 10 Torr, especially 3 Torr by regulating the valve 23. In this instance, exhaust pipes 38 and 48 between the chambers 30 and 40 and the reaction chamber 10 are heated by heaters 39 and 49 mounted thereon, respectively. Even if the gas mixture flows back from reaction chamber 10 in the pipes 38 and 48 toward the chambers 30 and 40, it is vapor-decomposed by heat to deposit silicon nitride and silicon on the interior surfaces of the pipes 38 and 48, preventing the silicon nitride and silicon from deposition on the inside surfaces of the chambers 30 and 40. Furthermore, in order to prevent such a reverse flowing of the gas mixture, the valve 36 is opened, through which nitrogen or argon gas is introduced from the gas source 35 into the chambers 30 and 40.

In such a condition, the gas mixture is excited by light or ultraviolet rays from the light source 31 disposed in the light source chamber 30, by which it is excited and vapor-decomposed, depositing a silicon nitride layer as the insulating layer 5b or 203a on the substrate 1 or 201 at a rate, for example of 17 Å/min.

(15) Next, when the insulating silicon nitride layer 5b or 203a is deposited to a thickness of 30 to 400 Å the power source 15 is turned OFF and then the valves 15B, 19A and 36 are closed but the valve 23 is fully opened, evacuating the chambers 10 and 30 to the same degree of vacuum as that under which the chamber 70 is held.

(16) Next, the valve 23 is closed and the pump system 22 is stopped and then the shutter means 71 is opened, through which the holder 81 carrying the substrate 1 or 201 with the insulating silicon nitride layer 5b or 203a deposited thereon is moved from the chamber 10 to the chamber 70.

(17) Next, the shutter means 71 is closed and then the valve 76 is opened, through which the pressure in the chamber 70 is raised to the atmospheric pressure.

(18) Next, the shutter means 72 is opened, through which the holder 81 is taken out to the outside and then the substrate 1 or 201 having formed thereon the insulating silicon nitride layer is removed from the holder 81.

In the manner described above, the insulating silicon nitride layer 5b or 203a is formed.

(19) Next, the holder 81 with no substrate 1 or 201 mounted thereon is placed in the chamber 70, after which the shutter means 72 and the valve 76 are closed, the valve 24 is opened to the chamber 70 and the vacuum pump system 22 is put in operation, evacuating the chamber 70 to the same degree of vacuum as that under which the chamber 10 is retained.

(20) Next, the valve 24 is closed relative to the both chambers 70 and 10, after which the shutter means 71 is opened, through which the holder 81 is placed in the chamber 10, and then the shutter means 71 is closed.

(21) Next, the valve 19 B connected to the lower nozzle parts 12b of the nozzle 11 is opened, through which nitrogen fluoride ($NF_3$ or $N_2F_4$) is introduced as a first cleaning gas from the gas source 18B into the chamber 10. On the other hand, the valve 23 is opened and the valve 24 is opened to the chamber 10 and then the pump system 22 is put in operation, holding the pressure in the chamber 10 at 0.1 Torr.

(22) Next, the power source 15 is turned ON.

In such a condition, the first cleaning gas is discharged or excited into a plasma by electric power from the power source 15, etching away unnecessary layers deposited on the inside surface of the chamber 10, the inside surfaces of the windows 33 and 43, the outside surface of the nozzle 11 and the outside surface of the holder 81. The unnecessary layers are composed of the materials of above-said first and second insulating layer.

(23) Next, when the unnecessary layers are almost etched away, the power source 15 is turned OFF and the valve 19B is closed, but the valve 19C is opened, through which hydrogen as a second cleaning gas, supplied from the gas source 18C, is introduced into the chamber 10, maintaining the pressure therein at 0.1 Torr.

(24) Next, the power source 15 is turned ON again. The second cleaning gas is discharged or excited into a plasma by electric power from the power source 15, cleaning the interior of the reaction chamber 10 including the windows 33 and 43, and the nozzles 11 and the holder 81.

(25) Next, the power source 15 is turned OFF, after which the valve 19C is closed and the valve 23 is fully opened, through which the chamber 10 is evacuated. When the chamber 10 is evacuated to the same degree of vacuum as that under which the chamber 70 is retained, the valve 23 is closed, stopping the pump system 22 from operation.

Thus a series of steps for forming the insulating silicon nitride layer 5b or 203a is completed.

Next, a description will be given of a embodiment of the formation of the insulating aluminum nitride (AlN) layer 5b and 203a.

The embodiment employs a same steps as those in the abovesaid formation of the insulating silicon nitride layer except the following steps.

(14') In step (14) methyl aluminum ($Al(CH_3)_3$), instead of the disilane, is introduced from the gas source 14A into the chamber 10, whereby the insulating aluminum nitride (AlN) layer 5b or 203a is deposited on the substrate 1 or 201. In this case, the deposition rate of the first aluminum nitride layer is, for example 230 Å/min.

While in the foregoing the present invention has been described in connection with the cases of forming the insulating silicon or aluminum nitride layer, it is also possible to form an insulating layer different material selected from a group consisting of, for example, $SiO_2$, phosphate glass, and borosilicate glass. Moreover, although in the foregoing a low pressure mercury lamp is employed as the light source, an excimer laser (of a wavelength 100 to 400 nm), an argon laser and a nitrogen laser can also be used. Furthermore HF gas, a gas mixture of $NF_3$ gas and $H_2$ gas, $NCl_3$ gas can also be used as the cleaning gas.

It will be apparent that many modifications and variations may be effected without departing from the scope of the novel concepts of the present invention.

What is claimed is:

1. A method of manufacturing a semiconductor device having at least a gate electrode, a gate insulating film on the gate electrode, an amorphous semiconductor layer on the gate insulating film and a pair of n+ type semiconductor layers formed on the amorphous semiconductor layer, said method comprising the steps of:

placing a substrate having said gate electrode formed thereon in a reaction chamber;

introducing a film forming gas into said reaction chamber;

forming said gate insulating film on sais gate electrode by exciting said film forming gas in said reaction chamber;

introducing a cleaning gas into said reaction chamber after the formation of said gate insulating film;

etching an unnecessary layer formed on an inside of said reaction chamber by exciting said cleaning gas;

forming said pair of n+ type semiconductor layers on said amorphous semiconductor layer; and forming source and drain electrodes on said pair of n+ type semiconductor layers, wherein an inner edge and an outer edge of said pair of n+ type semiconductor layers are coextensive with an inner edge and an outer edge of said source and drain electrodes.

2. A method according to claim 1 wherein said reaction chamber is evacuated during said etching.

3. A Method according to claim 1 wherein said gate insulating film is formed by photo CVD.

4. A method according to claim 1 wherein said reaction chamber is evacuated by utilizing a turbo-molecular pump connected with a rotary pump during said etching.

5. A method according to claim 1 wherein said gate insulating film comprises silicon nitride.

6. A method according to claim 1 wherein said cleaning gas comprises a method selected from the group consisting of HF, $NCL_3$, $NF_3$ and $N_2F_4$.

7. The method according to claim 1 further comprising a step of evacuating said reaction chamber both during said forming and said etching using a turbo-molecular pump.

8. The method according to claim 7 wherein said reaction chamber is evacuated both during said forming and said etching using said turbo-molecular pump in tandem with a rotary pump.

9. The method according to claim 1 wherein said cleaning gas comprises nitrogen fluoride and said method further comprises the steps of:
   introducing a second cleaning gas comprising hydrogen into said reaction chamber after said etching; and
   cleaning the inside of said reaction chamber by exciting said second cleaning gas.

10. A method of manufacturing a semiconductor device having at least a gate electrode, a gate insulating film on the gate electrode, and a semiconductor layer on the gate insulating film, said method comprising the steps of:
   placing a substrate having said gate electrode formed thereon in a reaction chamber;
   introducing a film forming gas into said reaction chamber;
   forming said gate insulating film on said gate electrode by exciting said film forming gas in said reaction chamber;
   introducing a cleaning gas into said reaction chamber after the formation of said gate insulating film;
   etching an unnecessary layer formed on an inside of said reaction chamber by exciting said cleaning gas,
   wherein said gate insulating film comprises silicon nitride.

11. A method according to claim 10 wherein said reaction chamber is evacuated during said etching.

12. A method according to claim 10 wherein said gate insulating film is formed by photo CVD.

13. A method according to claim 10 wherein said reaction chamber is evacuated by utilizing a turbo-molecular pump connected with a rotary pump during said etching.

14. The method according to claim 10 further comprising a step of evacuating said reaction chamber both during said forming and said etching using a turbo-molecular pump.

15. The method according to claim 14 wherein said reaction chamber is evacuated both during said forming and said etching using said turbo-molecular pump in tandem with a rotary pump.

16. The method according to claim 10 wherein said cleaning gas comprises nitrogen fluoride and said method further comprises the steps of:
   introducing a second cleaning gas comprising hydrogen into said reaction chamber after said etching; and
   cleaning the inside of said reaction chamber by exciting said second cleaning gas.

17. A method of manufacturing a semiconductor device having at least a gate electrode, a gate insulating film adjacent to the gate electrode, and a semiconductor adjacent to the gate insulating film, said method comprising the steps of:
   introducing a film forming gas into said reaction chamber;
   forming said gate insulating film in said reaction chamber;
   introducing a cleaning gas into said reaction chamber after the formation of said gate insulating film;
   etching an unnecessary layer formed on an inside of said reaction chamber by exciting said cleaning gas,
   wherein said gate insulating film comprises silicon nitride.

18. The method according to claim 17 further comprising a step of evacuating said reaction chamber during said etching using a turbo-molecular pump.

19. The method according to claim 18 wherein said reaction chamber is evacuated during said etching with said turbo-molecular pump in tandem with a rotary pump.

20. The method according to claim 17 further comprising a step of evacuating said reaction chamber both during said forming and said etching using a turbo-molecular pump.

21. The method according to claim 20 wherein said reaction is evacuated both during said forming and said etching using said turbo-molecular pump in tandem with a rotary pump.

22. The method according to claim 17 wherein said cleaning gas comprises nitrogen fluoride and said method further comprises the steps of:
   introducing a second cleaning gas comprising hydrogen into said reaction chamber after said etching; and
   cleaning the inside of said reaction chamber by exciting said second cleaning gas.

23. The method according to claim 17 wherein said gate insulating film is formed by photo CVD.

24. A method of manufacturing a semiconductor device having at least a gate electrode, a gate insulating film adjacent to the gate electrode, and a semiconductor adjacent to the gate insulating film, said method comprising the steps of:
   introducing a film forming gas into said reaction chamber;
   forming said gate insulating film in said reaction chamber;
   introducing a cleaning gas into said reaction chamber after the formation of said gate insulating film;
   etching an unnecessary layer formed on an inside of said reaction chamber by exciting said cleaning gas,
   wherein said gate insulating film comprises silicon nitride, and
   wherein said gas insulating film is formed on said semiconductor.

25. The method according to claim 24 further comprising a step of evacuating said reaction chamber during said etching using a turbo-molecular pump.

26. The method according to claim 25 wherein said reaction chamber is evacuated during said etching with said turbo-molecular pump in tandem with a rotary pump.

27. The method according to claim 24 further comprising a step of evacuating said reaction chamber both during said forming and said etching using a turbo-molecular pump.

28. The method according to claim 27 wherein said reaction chamber is evacuated both during said forming and said etching using said turbo-molecular pump in tandem with a rotary pump.

29. The method according to claim 24 wherein said cleaning gas comprises nitrogen fluoride and said method further comprises the steps of:
   introducing a second cleaning gas comprising hydrogen into said reaction chamber after said etching; and
   cleaning the inside of said reaction chamber by exciting said second cleaning gas.

30. The method according to claim 24 wherein said gate insulating film is formed by photo CVD.

31. A method of manufacturing an insulated gate field effect transistor comprising the steps of:
   forming a gate electrode over a substrate;
   forming a gate insulating film adjacent to said gate electrode by CVD in a reaction chamber;
   introducing a cleaning gas comprising $NF_3$ into said reaction chamber after the formation of said gate insulating film;

exciting said cleaning gas in order to remove an unnecessary layer from an inside of said reaction chamber, wherein said unnecessary layer comprises a material which is formed during the formation of said gate insulating film.

32. The method according to claim 31 wherein said gate electrode is formed below said gate insulating film.

33. The method according to claim 31 wherein said gate insulating film comprises silicon nitride.

34. The method according to claim 31 wherein said gate insulating film is formed by photo CVD.

35. The method according to claim 31 wherein said substrate is a semiconductor substrate.

36. A method of manufacturing an insulated gate field effect transistor comprising the steps of:

forming a gate electrode over a substrate;

forming a gate insulating film adjacent to said gate electrode by CVD in a reaction chamber;

introducing a cleaning gas comprising $NF_3$ into said reaction chamber after the formation of said gate insulating film;

exciting said cleaning gas in order to remove an unnecessary layer from an inside of said reaction chamber, wherein said unnecessary layer comprises a material which is formed during the formation of said gate insulating film, wherein said gate electrode is formed on said gate insulating film.

37. The method according to claim 36 wherein said gate insulating film comprises silicon nitride.

38. The method according to claim 36 wherein said gate insulating film is formed by photo CVD.

39. The method according to claim 36 wherein said substrate is a semiconductor substrate.

40. A method of manufacturing an insulated gate field effect transistor comprising the steps of:

forming a gate electrode comprising a material selected from the group consisting of Mo, Ti, W, $WSi_2$, $MoSi_2$, and $TiSi_2$ over a substrate;

forming a gate insulating film adjacent to said gate electrode by CVD in a reaction chamber;

introducing a cleaning gas comprising $NF_3$ into said reaction chamber after the formation of said gate insulating film;

exciting said cleaning gas in order to remove an unnecessary layer from an inside of said reaction chamber, wherein said unnecessary layer comprises a material which is formed during the formation of said gate insulating film.

41. The method according to claim 40 wherein said gate electrode is formed below the gate insulating film.

42. The method according to claim 40 wherein said gate insulating film comprises silicon nitride.

43. The method according to claim 40 wherein said gate insulating film is formed by photo CVD.

44. The method according to claim 40 wherein said substrate is a semiconductor substrate.

45. The method according to claim 40 wherein said gate insulating film comprises silicon nitride.

46. The method according to claim 40 wherein said gate insulating film is formed by photo CVD.

47. The method according to claim 40 wherein said substrate is a semiconductor substrate.

48. A method of manufacturing an insulated gate field effect transistor comprising the steps of:

forming a gate electrode comprising a material selected from the group consisting of Mo, Ti, W, $WSi_2$, $MoSi_2$, and $TiSi_2$ over a substrate;

forming a gate insulating film adjacent to said gate electrode by CVD in a reaction chamber;

introducing a cleaning gas comprising $NF_3$ into said reaction chamber after the formation of said gate insulating film;

exciting said cleaning gas in order to remove an unnecessary layer from an inside of said reaction chamber, wherein said unnecessary layer comprises a material which is formed during the formation of said gate insulating film, wherein said gate electrode is formed on said gate insulating film.

* * * * *

UNITED STATES PATENT AND TRADEMARK OFFICE
CERTIFICATE OF CORRECTION

PATENT NO. : 6,784,033 B1  
DATED : August 31, 2004  
INVENTOR(S) : Shunpei Yamazaki It is certified that error appears in the above-identified patent and that said Letters Patent is hereby corrected as shown below:

<u>Title page,</u>
Item [63], Related U.S. Application Data, should read as follows:
-- Continuation of application No. 08/113,759, filed on Aug. 31, 1993, now abandoned, which is a continuation of application No. 07/985,445, filed on Dec. 3, 1992, now abandoned, which is a continuation of application No. 07/767,625, filed on Sep. 30, 1991, now abandoned, which is a continuation of application No. 07/471,060, filed on Jan. 29, 1990, now abandoned, which is a continutation of application No. 07/304,888, filed on Feb. 1, 1989, now abandoned, which is a continuation of application No. 06/808,554, filed on Dec. 13, 1985, now abandoned. --

Signed and Sealed this

Twenty-sixth Day of July, 2005

JON W. DUDAS  
*Director of the United States Patent and Trademark Office*